United States Patent [19]
Wadsworth

[11] Patent Number: 5,287,024
[45] Date of Patent: Feb. 15, 1994

[54] FET BIDIRECTIONAL SWITCHING ARRANGEMENTS AND METHODS FOR PREVENTING PN JUNCTIONS OF FETS FROM BEING FORWARD-BIASED

[75] Inventor: Douglas C. Wadsworth, Manotick, Canada

[73] Assignee: Northern Telecom Limited, Montreal, Canada

[21] Appl. No.: 6,407

[22] Filed: Jan. 21, 1993

[51] Int. Cl.$^5$ ............................... H03K 17/687
[52] U.S. Cl. ..................... 307/571; 307/573; 307/577; 307/584; 307/303.2
[58] Field of Search ............... 307/571, 572, 573, 577, 307/584, 249, 303.2

[56] References Cited
U.S. PATENT DOCUMENTS

| | | | |
|---|---|---|---|
| 4,227,098 | 10/1980 | Brown et al. | 307/584 |
| 4,672,246 | 6/1987 | Donovan | 307/571 |
| 4,682,061 | 7/1987 | Donovan | 307/571 |

*Primary Examiner*—William L. Sikes
*Assistant Examiner*—Toan Tran
*Attorney, Agent, or Firm*—C. W. Junkin

[57] ABSTRACT

A FET bidirectional switching arrangement comprises first and second FETs, and a limiting arrangement connected to the FETs. The FETs are operable in response to a first bias condition to pass current in series through the FETs in either of two opposite directions, and operable in response to a second bias condtion to block current through the FETs in both of the two opposite directions. The limiting arrangement senses the direction of current flowing through the FETs and limits a forward bias on a first pn junction of the first FET when the current flows in a first direction of the two opposite directions to limit undesired current flow through the first pn junction of the first FET. When the current flows in a second direction of the two opposite directions, the limiting arrangement limits a forward bias on a first pn junction of the second FET to limit undesired current flow through the first pn junction of the second FET.

20 Claims, 4 Drawing Sheets

FET BIDIRECTIONAL SWITCHING ARRANGEMENTS AND METHODS FOR PREVENTING PN JUNCTIONS OF FETS FROM BEING FORWARD-BIASED

FIELD OF THE INVENTION

This invention relates to switching arrangements which employ Field Effect Transistors (FETs). More particularly, this invention relates to FET switching arrangements in which the FETs pass current in either of two opposite directions in an on-state, and block current in both of the two opposite directions in an off-state.

BACKGROUND OF THE INVENTION

A known FET switching arrangement comprises two FETs connected source-to-source and gate-to-gate, each FET having a substrate or bulk region which is connected to its source. A biasing impedance is connected between the gates and sources of the FETs. The FETs are turned on by drawing bias current through the biasing impedance to develop a voltage between the gates and sources of the FETs which exceeds the threshold voltage of the FETs. When the FETs are turned on, the arrangement can pass current through the two FETs in series in either of two opposite directions. In the absence of such bias current, the biasing impedance ensures that the FETs are off, so that the arrangement blocks current in both of the two opposite directions.

When the FETs are turned on, and current is passed through the FETs in series, a pn junction defined by the drain and substrate or bulk region of one of the FETs is forward biased. The forward bias is the product of the current passed by the FETs and the on-impedance of the FETs. If this product is too large, the forward biased pn junction can inject enough carriers into the substrate or bulk region to cause undesired latching.

To avoid this problem, the FETs must be made large enough to ensure that their on-impedance will not develop sufficient voltage to turn on the pn junction at the maximum current to be passed by the switching arrangement. For many applications, the FETs must be made so large that, where the switching arrangement is part of a monolithic integrated circuit, its area has a significant impact on the total size and therefore the cost of the integrated circuit. A FET switching arrangement which permits the use of smaller FETs for most applications would therefore be desirable.

Another known FET switching arrangement combines a diode bridge with a single FET. The diode bridge is used to ensure that current flows in the same direction through the FET when the FET is on, regardless of the direction of current flow between external terminals of the switching arrangement. The direction of current flow through the FET is arranged to ensure that the pn junction defined by the drain and the substrate or bulk region is never forward biased, so that latching is not a problem.

Unfortunately, the diode bridge is required to withstand the full voltage applied to the switching arrangement without passing current when the FET is off. High voltage diodes are needed to meet this requirement, and such high voltage diodes are not available in many of the semiconductor technologies in which FET switching arrangements may be implemented.

In some FET circuits, the problem of undesired carrier injection into the substrate or bulk region of the FETs is avoided by applying an appropriate DC bias to the substrate or bulk region to ensure that the pn junctions through which such injection could occur are never forward biased. The DC bias applied to the substrate or bulk region is referenced to fixed supply voltages which power the FET circuits.

Unfortunately, this approach is not readily applicable to FET switching arrangements which do not have fixed supply voltages limiting the range of voltages applied to the FETs.

SUMMARY OF THE INVENTION

This invention seeks to provide FET switching arrangements and methods for operating FET switching arrangements which reduce or overcome the problems of known FET switching arrangements as outlined above.

One aspect of the invention provides a FET switching arrangement which comprises first and second FETs, and a limiting arrangement. The first and second FETs are operable in response to a first bias condition to pass current in series through the FETs in either of two opposite directions, and operable in response to a second bias condition to block current through the FETs in both of the two opposite directions. The limiting arrangement is connected to the FETs for sensing the direction of current flowing through the FETs, for limiting a forward bias on a first pn junction of the first FET when the current flows in a first direction of the two opposite directions to limit undesired current flow through the first pn junction of the first FET, and for limiting a forward bias on a first pn junction of the second FET when the current flows in a second direction of the two opposite directions to limit undesired current flow through the first pn junction of the second FET.

The limiting arrangement may comprise a sensing impedance connected in series with the FETs, and first and second switching devices. The first and second switching devices are operable in response to a voltage developed across the sensing impedance by current flow through the sensing impedance, the first switching device responding to a voltage of a first polarity to shunt the first pn junction of the first FET, and the second switching device responding to a voltage of a second polarity to shunt the first pn junction of the second FET.

Another aspect of the invention provides a method for operating a FET switching arrangement which comprises first and second FETs operable in response to a first bias condition to pass current in series through the FETs in either of two opposite directions and operable in response to a second bias condition to block current through the FETs in both of the two opposite directions. The method comprises sensing the direction of current flowing through the FETs, limiting a forward bias on a first pn junction of the first FET when the current flows in a first of the two opposite directions to limit undesired current flow through the first pn junction of the first FET, and limiting a forward bias on a first pn junction of the second FET when the current flows in a second of the two opposite directions to limit undesired current flow through the first pn junction of the second FET.

The forward bias on the first pn junctions may be limited by selectively shunting the first pn junctions.

Embodiments of the invention limit the forward bias on the critical pn junctions of the FETs by driving bulk regions of the FETs to an appropriate potential. This is achieved without reference to supply voltages of greater magnitude than voltages applied to the switching arrangement. In the embodiments, only the FETs and n-well to p-substrate junctions are required to have high breakdown voltages, and these requirements can be achieved in existing high voltage CMOS monolithic integrated circuit technology.

BRIEF DESCRIPTION OF THE DRAWINGS

Embodiments of the invention are described below by way of example only. Reference is made to accompanying drawings, in which.

DESCRIPTION OF EMBODIMENTS

Figure 1:
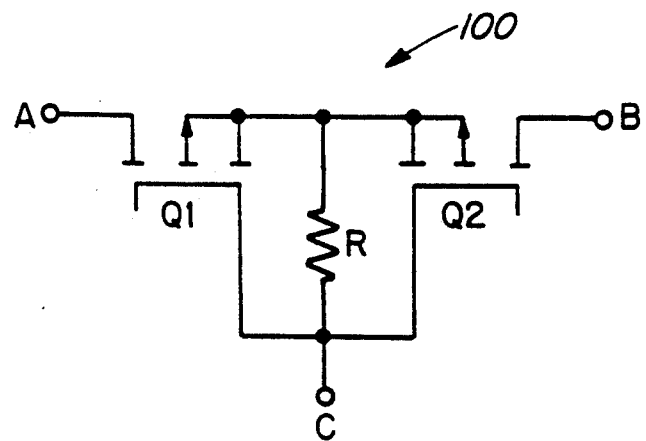
FIG. 1 is a schematic diagram of a known FET switching arrangement.

FIG. 1 is a schematic diagram of a known FET switching arrangement 100. The switching arrangement 100 comprises two FETs Q1, Q2 and a biasing resistor R. The FETs Q1, Q2 are turned on by drawing bias current through the resistor R to develop a voltage which exceeds the threshold voltage of the FETs Q1, Q2. When the FETs Q1, Q2 are turned on, the arrangement can pass current through the FETs Q1, Q2 in series, either from terminal A to terminal B, or from terminal B to terminal A. In the absence of such bias current, the resistance R ensures that the FETs Q1, Q2 are off, so that the arrangement blocks current flow in either direction between terminals A and B.

Figure 2:
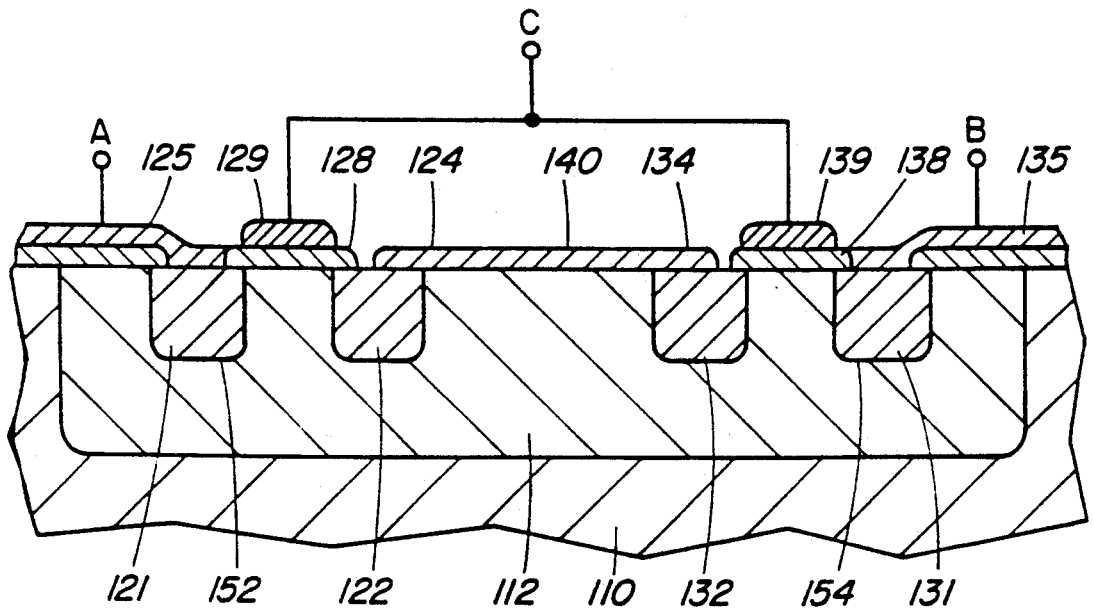
FIG. 2 is a cross-sectional diagram showing part of a possible integrated circuit implementation of the FET switching arrangement of FIG. 1.

FIG. 2 is a cross-sectional diagram showing part of a CMOS implementation of the known FET switching arrangement 100. The FETs Q1, Q2 are formed in a bulk region comprising an n-type doped well 112 in a p-type silicon substrate 110. The first FET Q1 comprises first and second p-type doped wells 121, 122 formed in the n-type doped well 112, source and drain contacts 124, 125 electrically contacting the p-typed doped wells 121, 122 respectively, and a gate comprising a gate oxide layer 128 and a gate metallization 129 formed on the n-type doped well 112 between the p-type doped wells 121, 122. The second FET Q2 comprises first and second p-type doped wells 131, 132 formed in the n-type doped well 112, source and drain contacts 134, 135 electrically contacting the p-typed doped wells 131, 132 respectively, and a gate comprising a gate oxide layer 138 and a gate metallization 139 formed on the n-type doped well 112 between the p-type doped wells 131, 132. Metallization 140 which connects the second p-type wells 122, 132 of the FETs Q1, Q2 also contacts the n-type doped well 112. The resistor R, which is formed in or on the surface of the substrate 110, is not visible in the view presented in FIG. 2.

When the FETs Q1, Q2 are turned on and current is passed from terminal A through the FETs Q1, Q2 in series to terminal B, a pn junction 152 defined by the first p-type well 121 of the first FET Q1 and the n-type well 112 is forward biased. The forward bias is the product of the current passed by the FETs Q1, Q2 and the on-impedance of the first FET Q1. If this product is too large, the forward biased pn junction 151 can inject enough carriers into the n-type well 112 to cause undesired latching.

Similarly, when the FETs Q1, Q2 are turned on, and current is passed from terminal B through the FETs Q1, Q2 in series to terminal A, a pn junction 154 defined by the first p-type well 131 of the second FET Q2 and the n-type well 112 is forward biased, and this forward bias can inject enough carriers into the n-type well 112 to cause latching if the on-impedance of the FET Q2 is too large.

To avoid this problem, the FETs Q1, Q2 must be made large enough to ensure that their on-impedance will not develop sufficient voltage to turn on the pn junctions 152, 154 at the maximum current to be passed by the switching arrangement 100. For many applications, the FETs Q1, Q2 must be made so large that their area has a significant impact on the size and cost of an integrated circuit including the switching arrangement 100.

Figure 3:
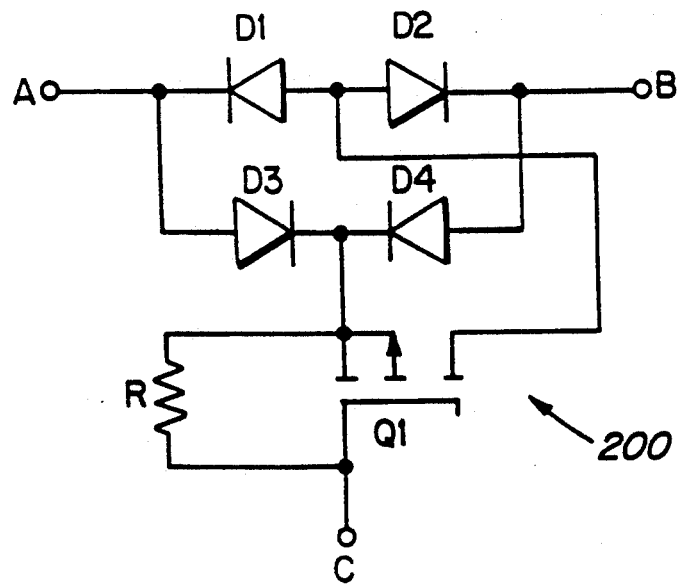
FIG. 3 is a schematic diagram of another known FET switching arrangement.

FIG. 3 is a schematic diagram of another known FET switching arrangement 200. This switching arrangement 200 combines single FET Q1 with a diode bridge comprising four diodes D1, D2, D3, D4. The diodes D1, D2, D3, D4 ensure that current flows in the same direction through the FET Q1 when it is on, regardless of the direction of current flow between external terminals A, B of the switching arrangement 200. The direction of current flow through the FET Q1 is arranged to ensure that a pn junction defined by the drain and the substrate or bulk region of the FET Q1 is never forward biased, so that latching is not a problem. Unfortunately, the diodes D1, D2, D3, D4 must withstand the full voltage applied between terminals A and B of the switching arrangement 200 without passing current when the FET Q1 is off. High voltage diodes are needed to meet this requirement, and such high voltage diodes are not available in many of the semiconductor technologies in which FET switching arrangements may be implemented.

Figure 4:
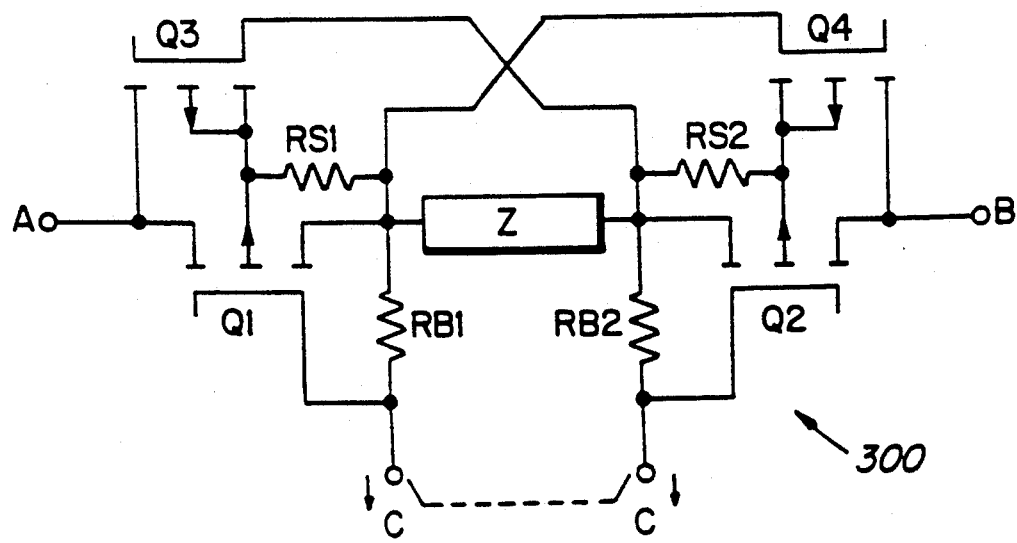
FIG. 4 is a schematic diagram of a FET switching arrangement according to a first embodiment of the invention.

FIG. 4 is a schematic diagram of a FET switching arrangement 300 according to a first embodiment of the invention. The switching arrangement 300 comprises first and second FETs Q1, Q2, and a limiting arrangement comprising a sensing impedance Z and third and fourth FETs Q3, Q4. The switching arrangement 300 further comprises shunt impedances RS1, RS2 and FET-biasing impedances RB1, RB2.

Figure 5:
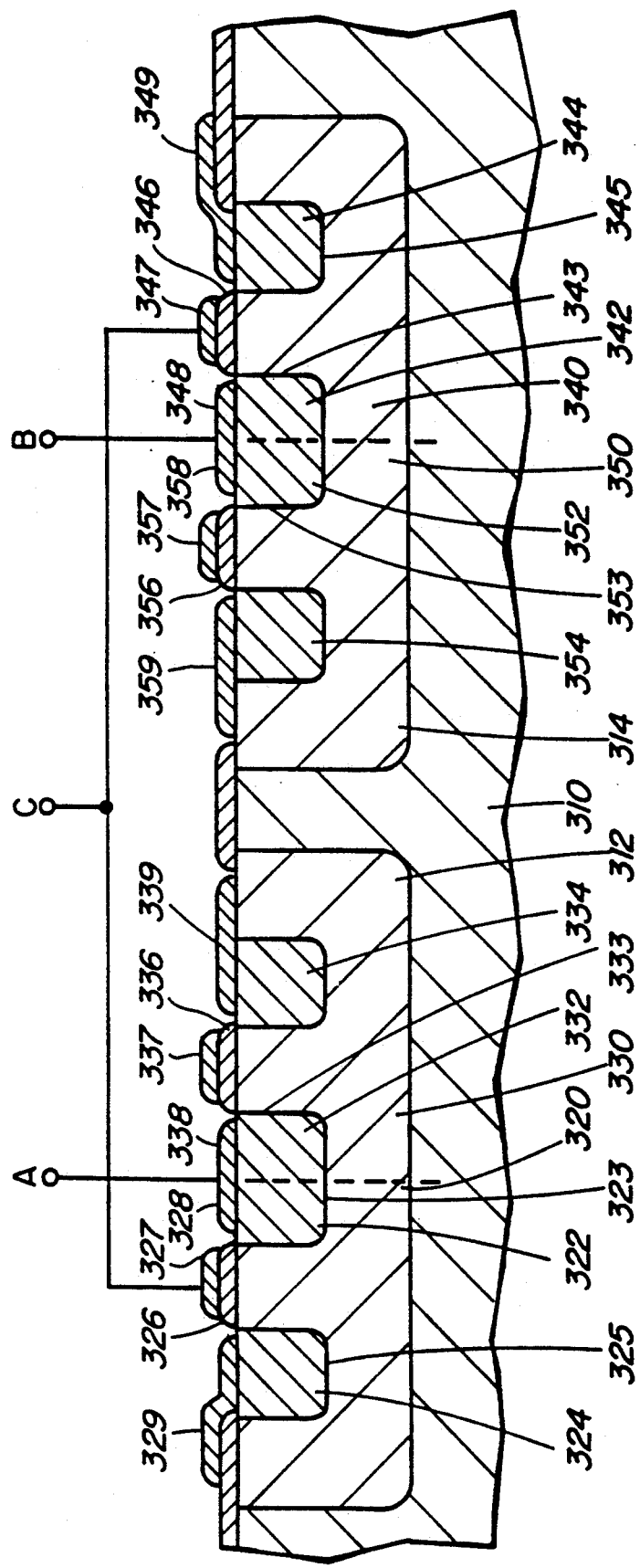
FIG. 5 is a cross-sectional diagram showing a possible integrated circuit implementation of the FETs of the FET switching arrangement of FIG. 4.

FIG. 5 is a cross-sectional diagram showing a possible CMOS implementation of the FETs Q1, Q2, Q3, Q4 of the FET switching arrangement 300. The FETs Q1, Q2, Q3, Q4 are formed on a p-type silicon substrate 310. A first n-type doped well 312 defines first and second contiguous bulk regions 320, 330 of the first and third FETs Q1, Q3 respectively. A second n-type doped well 314 spaced from the first n-type doped well 312 defines third and fourth contiguous bulk regions 340, 350 of the second and fourth FETs Q2, Q4 respectively.

The first FET Q1 further comprises first and second p-type doped wells 322, 324 spaced apart within the first bulk region 320. The first and second doped wells 322, 324 together with the first bulk region 320 define first and second pn junctions 323, 325 respectively of the first FET Q1. A gate of the first FET Q1, comprising a gate oxide 326 and a gate metallization 327, is formed on the bulk region 320 between the first and second doped wells 322, 324, and metallizations 328, 329 act as source and drain contacts.

The third FET Q3 further comprises first and second p-type doped wells 332, 334 spaced apart within the second bulk region 330, and a gate, comprising a gate oxide 336 and a gate metallization 337, formed on the bulk region 330 between the first and second doped wells 332, 334. The first doped well 332 is contiguous with the first doped well 322 of the first FET Q1. Metallizations 338, 339 contacting the first and second doped wells 332, 334 act as source and drain contacts, metallization 338 being contiguous with metallization 328 of the first FET Q1 and metallization 339 also contacting the bulk region 330 of the third FET.

Similarly, the second FET Q2 further comprises first and second p-type doped wells 342, 344 spaced apart within the third bulk region 340. Together with the third bulk region 340, the first and second doped wells 342, 344 define first and second pn junctions 343, 345 of the second FET Q2. A gate of the second FET Q2 comprises a gate oxide 346 and a gate metallization 347 formed on the bulk region 340 between the first and second doped wells 342, 344. Metallizations 348, 349 contacting the first and second doped wells 342, 344 act as source and drain contacts.

The fourth FET Q4 further comprises first and second p-type doped wells 352, 354 spaced apart within the fourth bulk region 350, the first doped well 352 being contiguous with the first doped well 342 of the second FET Q2. A gate of the fourth FET Q4 comprises a gate oxide 356 and a gate metallization 357 formed on the bulk region 350 between the doped wells 352, 354, and metallizations 358, 359 act as source and drain contacts, metallization 358 being contiguous with metallization 348 of the second FET Q2 and metallization 359 also contacting the bulk region 350 of the fourth FET Q4.

As shown in FIG. 4, the sensing impedance Z is connected in series between the first and second FETs Q1, Q2. Current flow through the sensing impedance Z develops a voltage which is applied between the gate and source of the third and fourth FETs Q3, Q4. If the current flow is from terminal A to terminal B, the voltage has a first polarity and turns on the third FET Q3 to shunt the first pn junction 323 of the first FET Q1, thereby limiting the forward bias on that junction so as to limit undesired current flow through that junction. Conversely, if the current flow is from terminal B to terminal A, the voltage has a second polarity and turns on the fourth FET Q4 to shunt the first pn junction 343 of the second FET Q2, thereby limiting the forward bias on that junction so as to limit undesired current flow through that junction.

The first and second shunt impedances RS1, RS2 are connected across the second pn junctions 325, 345 of the first and second FETs Q1, Q2 respectively. The first shunt impedance RS1 is typically 100 kOhms, small enough to effectively shunt the bulk region 320 of the first FET Q1 to the second doped well 324 when the third FET Q3 is off, and large enough to allow the third FET Q3 to effectively shunt the bulk region 320 to the first doped well 322 when the third FET Q3 is on. At 100 kOhms, the shunt impedance RS1 is also large enough to limit the current through the third FET Q3 when it is on, thereby limiting the forward bias on a pn junction 333 defined by the first doped well 332 and the bulk region 330 of the third FET Q3 to limit unwanted current flow through that pn junction.

Similarly, the second shunt impedance RS2 at approximately 100 kOhms is small enough to effectively shunt the bulk region 340 of the second FET Q1 to the second doped well 344 when the fourth FET Q4 is off, and large enough to allow the fourth FET Q4 to effectively shunt the bulk region 340 to the first doped well 342 when the fourth FET Q4 is on. The second shunt impedance RS2 also limits the current through the fourth FET Q4 when it is on, thereby limiting the forward bias on a pn junction 353 defined by the first doped well 352 and the bulk region 350 of the fourth FET Q4 to limit unwanted current flow through that pn junction.

The first and second FET-biasing impedances RB1, RB2 are connected between the gates of the first and second FETs Q1, Q2 respectively and the second doped wells 324, 344 of the first and second FETs Q1, Q2 respectively. Current is drawn through the FET-biasing impedances RB1, RB2 to develop sufficient voltage to turn on the first and second FETs Q1, Q2 to permit current to flow between terminals A and B of the switching arrangement. The FET-biasing impedances RB1, RB2 are typically about 1 MOhm so that relatively little current is needed to turn on the first and second FETs Q1, Q2.

In the absence of current through the FET-biasing impedances RB1, RB2, the FET-biasing impedances RB1, RB2 ensure that the first and second FETs Q1, Q2 are off, and that there is no current flow between terminals A and B. Because there is no current flow through the sensing impedance Z, the third and fourth FETs Q3, Q4 are also off. Consequently, the voltage standoff capability of the switching arrangement 300 in its off-state is determined by the voltage standoff capability of the FETs Q1, Q2, Q3, Q4.

Figure 6:
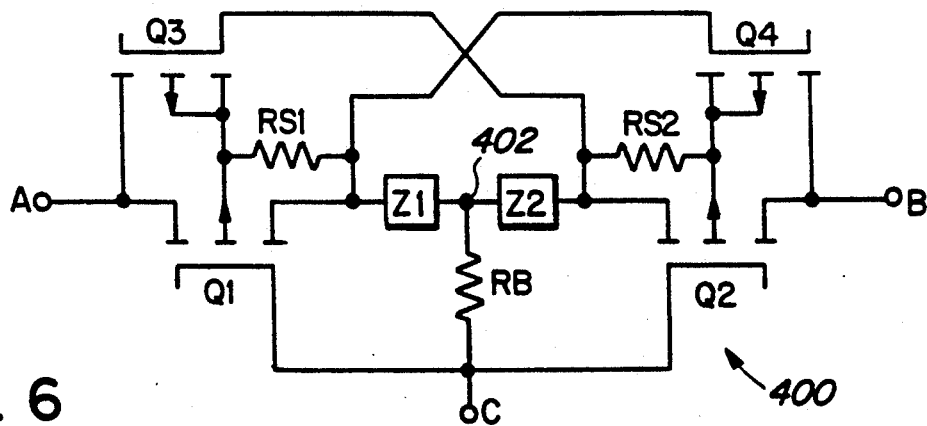
FIG. 6 is a schematic diagram of a FET switching arrangement according to a second embodiment of the invention.

FIG. 6 is a schematic diagram of a FET switching arrangement 400 according to a second embodiment of the invention. In this embodiment, the sensing impedance Z of the first embodiment is divided into two series-connected impedances Z1, Z2 connected at a connection point 402, and the two FET-biasing impedances RB1, RB2 of the first embodiment are replaced by a single FET-biasing impedance RB connected from the gates of the first and second FETs Q1, Q2 to the connection point 402. Supplying current to the single FET-biasing impedance RB is simpler than supplying current in phase to the two FET-biasing impedances RB1, RB2 of the first embodiment, but the series-connected impedances Z1, Z2 increase the current needed to turn on the first and second FETs Q1, Q2.

Figure 7:
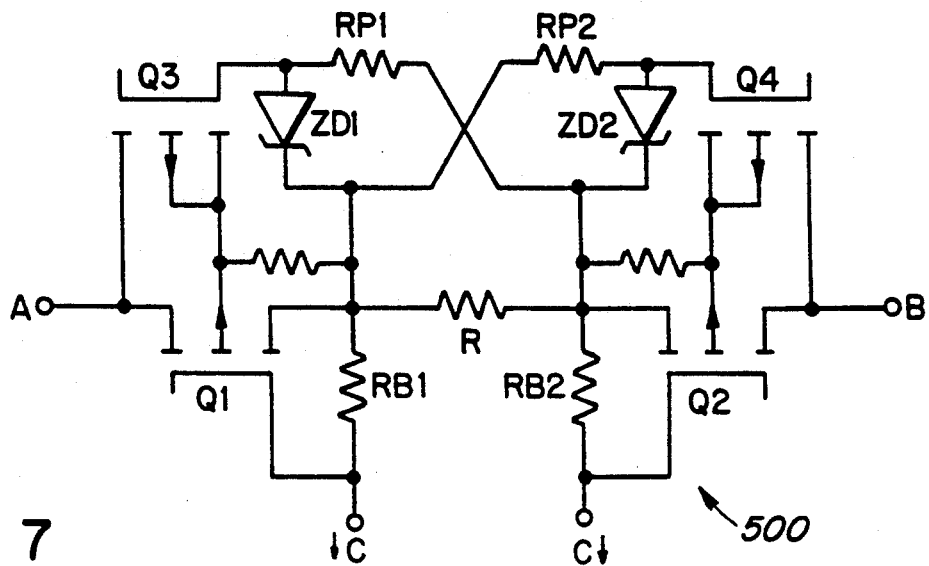
FIG. 7 is a schematic diagram of a FET switching arrangement according to a third embodiment of the invention.

Numerous modifications and refinements of the switching arrangements 300, 400 according to the first two embodiments can be made without departing from the principles of the invention. For example, FIG. 7 is a schematic diagram of a FET switching arrangement 500 according to a third embodiment of the invention.

The switching arrangement 500 is similar to the switching arrangement 300 of the first embodiment, except for the addition of first and second Zener diodes ZD1, ZD2, and first and second resistors RP1, RP2. The Zener diodes ZD1, ZD2 define a clamping arrangement which protects the third and fourth FETs Q3, Q4 by effectively limiting the voltage between the gate and the second doped well of the third and fourth FETs respectively. The resistors RP1, RP2 are provided to prevent excessive current flow through the Zener diodes ZD1, ZD2.

Figure 8:
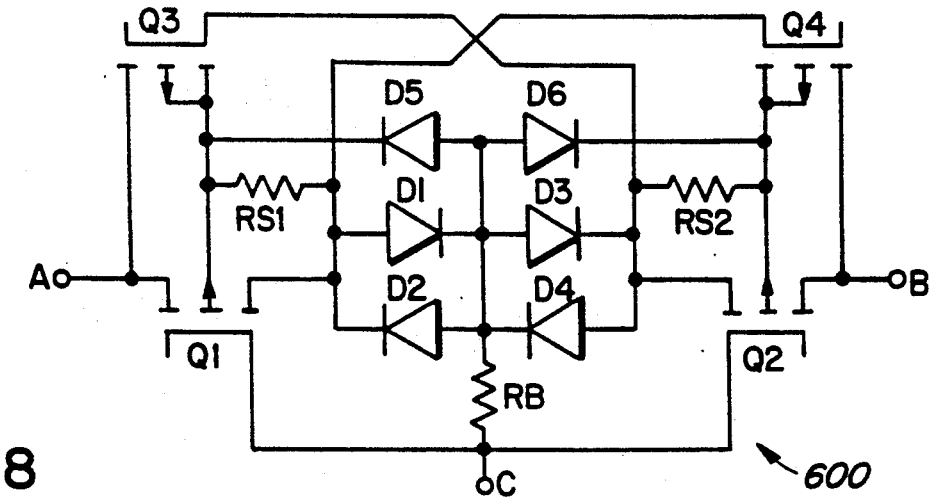
FIG. 8 is a schematic diagram of a FET switching arrangement according to a fourth embodiment of the invention.

FIG. 8 is a schematic diagram of a FET switching arrangement 600 according to a fourth embodiment of the invention. The switching arrangement 600 is similar to the switching arrangement 400 of the second embodiment, each of the series connected impedances Z1, Z2 defining the sensing impedance being implemented as a pair of pn junction diodes connected in anti-parallel. The diodes D1, D2, D3, D4 are selected such that the voltage across each of the diodes in its forward conducting state is greater than one half of the threshold voltage of the third and fourth FETs Q3, Q4.

The switching arrangement 600 further comprises pn junction diodes D5, D6 connected between the bulk regions 320, 340 of the first and second FETs Q1, Q2 respectively and the common connection point of the diodes D1, D2, D3, D4 defining the sensing impedance. These diodes D5, D6 provide a clamping arrangement which shunts the first shunt impedance RS1 when the current flow is from terminal B to terminal A and the third FET Q3 is off, and which shunts the second shunt impedance RS2 when the current flow is from terminal A to terminal B and the fourth FET Q4 is off. When the clamping diodes D5, D6 are provided, the shunt impedances RS1, RS2 can be increased to permit the size of the third and fourth FETs Q3, Q4 to be decreased without incurring unacceptable degradation due to noise or leakage.

A similar clamping arrangement could be added to the switching arrangement 300 of the first embodiment simply by splitting the sensing impedance Z into two equal series connected impedances, and connecting clamping diodes D5, D6 between the connection point of the series connected impedances and the bulk regions 320, 340 of the first and second FETs respectively.

While the embodiments described above employ p-channel FETs, similar switching arrangements could be implemented using n-channel FETs with inversions of polarity where appropriate. The bulk regions 320, 330, 340, 350 of the FETs Q1, Q2, Q3, Q4 may be doped wells 312, 314 in a substrate 310 of opposite polarity as in the embodiments described above, or may be the substrate 310 itself.

These and other modifications are within the scope of the invention as claimed below.

I claim:

1. A FET switching arrangement, comprising:
   first and second FETs operable in response to a first bias condition to pass current in series through the FETs in either of two opposite directions, and operable in response to a second bias condition to block current through the FETs in both of the two opposite directions; and
   a limiting arrangement connected to the FETs for sensing the direction of current flowing through the FETs, for limiting a forward bias on a first pn junction of the first FET when the current flows in a first direction of the two opposite directions to limit undesired current flow through the first pn junction of the first FET, and for limiting a forward bias on a first pn junction of the second FET when the current flows in a second direction of the two opposite directions to limit undesired current flow through the first pn junction of the second FET.

2. A FET switching arrangement as defined in claim 1, wherein the limiting arrangement comprises:
   a sensing impedance connected in series with the FETs; and
   first and second switching devices operable in response to a voltage developed across the sensing impedance by current flow through the sensing impedance, the first switching device responding to a voltage of a first polarity to shunt the first pn junction of the first FET, and the second switching device responding to a voltage of a second polarity to shunt the first pn junction of the second FET.

3. A FET switching arrangement as defined in claim 2, further comprising first and second shunt impedances connected across second pn junctions of the first and second FETs respectively.

4. A FET switching network as defined in claim 3, wherein the first and second switching devices comprise third and fourth FETs respectively, the third FET being connected across the first pn junction of the first FET, the fourth FET being connected across the first pn junction of the second FET, and the sensing impedance being connected between gates of the third and fourth FETs.

5. A FET switching arrangement as defined in claim 4, further comprising first and second FET-biasing impedances connected to gates of the first and second FETs respectively, the FET-biasing impedances for developing the first and second bias conditions in the absence or presence respectively of a current of a suitable polarity passing through the FET-biasing impedances.

6. A FET switching arrangement as defined in claim 4, wherein:
   the sensing impedance comprises first and second impedances connected in series between the first and second FETs, the first and second impedances being connected at a connection point; and
   the FET switching arrangement further comprises a FET-biasing impedance connected from gates of the first and second FETs to the connection point for developing the first and second bias conditions in the absence and presence respectively of a current of suitable polarity passing through the FET-biasing impedance.

7. A FET switching arrangement as defined in claim 6, wherein each of the first and second impedances comprises a pair of pn junctions connected in anti-parallel.

8. A FET switching arrangement as defined in claim 4, comprising clamping arrangements for protecting the third and fourth FETs.

9. A FET switching arrangement as defined in claim 3, comprising clamping arrangements responsive to the direction of current flow through the sensing impedance for shunting the second shunt impedance when the current flows in the first direction and for shunting the first shunt impedance when the current flows in the second direction.

10. A method of operating a FET switching arrangement comprising first and second FETs operable in response to a first bias condition to pass current in series through the FETs in either of two opposite directions and operable in response to a second bias condition to block current through the FETs in both of the two opposite directions, the method comprising sensing the direction of current flowing through the FETs, limiting a forward bias on a first pn junction of the first FET when the current flows in a first of the two opposite directions to limit undesired current flow through the first pn junction of the first FET, and limiting a forward bias on a first pn junction of the second FET when the current flows in a second of the two opposite directions to limit undesired current flow through the first pn junction of the second FET.

11. A method as defined in claim 10, comprising limiting the forward bias on the first pn junctions by selectively shunting the first pn junctions.

12. A FET switching arrangement, comprising:
 first and second FETs operable in response to a first bias condition to pass current in series through the FETs in either of two opposite directions, and operable in response to a second bias condition to block current flow through the FETs in both of the two opposite directions, each of the first and second FETs comprising a bulk region of a first doping polarity, first and second doped wells of a second doping polarity opposite to the first doping polarity, the first and second doped wells being spaced apart within the bulk region, and a gate on the bulk region between the first and second doped wells, the first doped well and the bulk region together defining a first pn junction of each FET and the second doped well and the bulk region together defining a second pn junction of each FET; and
 a limiting arrangement connected to the FETs for sensing the direction of current flow through the FETs, for limiting a forward bias on the first pn junction of the first FET when majority carrier current flows from the first doped well to the bulk region in the first FET to limit undesired current flow through the first pn junction of the first FET. and for limiting a forward bias on a first junction of the second FET when majority carrier current flows from the first doped well to the bulk region in the second FET to limit undesired current flow through the first pn junction of the second FET.

13. A FET switching arrangement as defined in claim 12, wherein the limiting arrangement comprises:
 a sensing impedance connected between the second doped well of the first FET and the second doped well of the second FET;
 a third FET having a bulk region of the first doping polarity, first and second first doped wells of the second doping polarity spaced apart within the bulk region, and a gate on the bulk region between the first and second doped wells, the first doped well being connected to the first doped well of the first FET, the second doped well and the bulk region being connected to the bulk region of the first FET, and the gate being connected to the second doped well of the second FET; and
 a fourth FET having a bulk region of the first doping polarity, first and second doped wells of the second doping polarity spaced apart within the bulk region, and a gate on the bulk region between the first and second doped wells, the first doped well being connected to the first doped well of the second FET, the second doped well and the bulk region being connected to bulk region of the second FET, and the gate being connected to the second doped region of the first FET.

14. A FET switching arrangement as defined in claim 13, further comprising:
 a first shunt impedance connected between the bulk region and the second doped well of the first FET; and
 a second shunt impedance connected between the bulk region and the second doped well of the second FET.

15. A FET switching arrangement as defined in claim 14, further comprising:
 a first FET-biasing impedance connected between the second doped well and the gate of the first FET; and
 a second FET-biasing impedance connected between the second doped well and the gate of the second FET.

16. A FET switching arrangement as defined in claim 14, wherein:
 the sensing impedance comprises first and second impedances connected in series between the second doped wells of the first and second FETs, the first and second impedances being connected at a connection point;
 the gates of the first and second FETs are connected together; and
 the FET switching arrangement further comprises a FET-biasing impedance connected between the gates of the first and second FETs and the connection point.

17. A FET switching arrangement as defined in claim 16, wherein each of the first and second impedances comprises a pair of pn junctions connected in anti-parallel.

18. A FET switching arrangement as defined in claim 14, further comprising:
 a first Zener diode connected between the gate and the second doped well of the third FET to protect the third FET; and
 a second Zener diode connected between the gate and the second doped well of the fourth FET to protect the fourth FET.

19. A FET switching arrangement as defined in claim 14, wherein:
 the sensing impedance comprises first and second impedances connected in series between the second doped wells of the first and second FETs, the first and second impedances being connected at a connection point, each of the first and second impedances comprising a pair of pn junctions connected in anti-parallel; and
 the FET switching arrangement further comprises a first pn junction connected between the bulk region of the first FET and the connection point for shunting the first shunt impedance when the third FET is off, and a second pn junction connected between the bulk region of the second FET and the connection point for shunting the second shunt impedance when the fourth FET is off.

20. A FET switching arrangement as defined in claim 12 implemented as a monolithic integrated circuit, wherein:
 the bulk region of the first FET is contiguous with the bulk region of the third FET and the first doped well of the first FET is contiguous with the first doped well of the third FET; and
 the bulk region of the second FET is contiguous with the bulk region of the fourth FET and the first doped well of the second FET is contiguous with the first doped well of the fourth FET.

* * * * *